United States Patent
Acra et al.

(10) Patent No.: US 9,650,594 B2
(45) Date of Patent: *May 16, 2017

(54) SOLUTIONS AND PROCESSES FOR REMOVING SUBSTANCES FROM SUBSTRATES

(71) Applicant: Dynaloy, LLC, Kingsport, TN (US)

(72) Inventors: Travis Acra, Ingalls, IN (US); Richard Dalton Peters, Westfield, IN (US); Kimberly Dona Pollard, Pendleton, IN (US); Donald James Pfettscher, Martinsville, IN (US)

(73) Assignee: Dynaloy, LLC, Kingsport, TN (US)

( * ) Notice: Subject to any disclaimer, the term of this patent is extended or adjusted under 35 U.S.C. 154(b) by 55 days.

This patent is subject to a terminal disclaimer.

(21) Appl. No.: 14/602,414

(22) Filed: Jan. 22, 2015

(65) Prior Publication Data
US 2016/0215240 A1    Jul. 28, 2016

(51) Int. Cl.
*C11D 3/30* (2006.01)
*C11D 7/32* (2006.01)
(Continued)

(52) U.S. Cl.
CPC ............ *C11D 7/3209* (2013.01); *C11D 7/261* (2013.01); *C11D 7/263* (2013.01); *C11D 7/3218* (2013.01); *C11D 7/3263* (2013.01); *C11D 11/0047* (2013.01); *H01L 21/02068* (2013.01); *H01L 21/0275* (2013.01); *H01L 24/11* (2013.01); *C11D 3/2068* (2013.01); *H01L 24/13* (2013.01); *H01L 24/14* (2013.01); *H01L 2224/11002* (2013.01); *H01L 2224/1132* (2013.01); *H01L 2224/1146* (2013.01);
(Continued)

(58) Field of Classification Search
CPC ........... C11D 3/2068; C11D 3/28; C11D 3/30; C11D 3/32; C11D 7/263; C11D 7/3218; C11D 7/3209; C11D 7/50; C11D 7/5004
USPC ....... 510/175, 176, 245, 254, 499, 500, 504, 510/505, 506
See application file for complete search history.

(56) References Cited

U.S. PATENT DOCUMENTS

| | | |
|---|---|---|
| 7,078,371 B2 | 7/2006 | Ikemoto |
| 2002/0128164 A1 | 9/2002 | Hara et al. |

(Continued)

OTHER PUBLICATIONS

Green Chemicals Blog, "Stepan launches a new surfactant from joint R&D with Elevance", Doris De Guzman, p. 1-2, Mar. 24, 2014.*

(Continued)

*Primary Examiner* — Gregory R Delcotto
(74) *Attorney, Agent, or Firm* — Matthew W. Smith; Dennis V. Carmen (57) ABSTRACT

The disclosure is directed solutions and processes to remove substances from substrates. Optionally, the substances can include photoresist on semiconductor wafers. The solution may include a quaternary ammonium hydroxide, a first amine, a second amine, and a third amine with the total amount of amine being no greater than about 95% by weight of a total weight of the solution. Additionally, a solution may include at least one amine, a quaternary ammonium hydroxide, and water and be free of a polar solvent other than water with the solution having a dynamic viscosity that is no greater than about 60 centipoise.

18 Claims, 2 Drawing Sheets

(51) Int. Cl.
*C11D 7/50* (2006.01)
*C11D 7/26* (2006.01)
*H01L 21/027* (2006.01)
*H01L 23/00* (2006.01)
*H01L 21/02* (2006.01)
*C11D 11/00* (2006.01)
*C11D 3/20* (2006.01)

(52) U.S. Cl.
CPC ............... *H01L 2224/1147* (2013.01); *H01L 2224/11849* (2013.01); *H01L 2224/131* (2013.01); *H01L 2224/14181* (2013.01); *H01L 2224/16145* (2013.01); *H01L 2224/16227* (2013.01)

(56) References Cited

U.S. PATENT DOCUMENTS

2010/0105595 A1\* 4/2010 Lee .................... C09G 1/02
510/176

2014/0087313 A1 3/2014 Ueno et al.
2014/0137894 A1 5/2014 Peters et al.
2014/0142017 A1 5/2014 Peters et al.

OTHER PUBLICATIONS

Stepan Product Bulletin, Steposol MET-10U, p. 1-3, Mar. 2014.\*
Steposol MET-10U Metal Cleaning, "Surfactant Solution to Solvent replacemant", pp. 1-2, 2014.\*
"Stepan Launcehs Steposol MET-10U, a Powerful, Sustainable Surfactant Designed to Replace Solvents", p. 1-2, Mar. 24, 2014.\*
Notification of Transmittal of the International Search Report and the Written Opinion of the International Searching Authority with Date of Mailing Apr. 29, 2016 for International Application No. PCT/US2016/012107.
Jenkins, Scott; "Renewable Surfactant Can Replace Solvents for Cleaning"; Chemical Engineering; May 1, 2014; vol. 121(5); pp. 12; Abstract.
Standard Test Method for Kinematic Viscosity of Transparent and Opaque Liquids (and Calculation of Dynamic Viscosity).

\* cited by examiner

PROVIDE A SUBSTRATE INCLUDING A FIRST SIDE AND A SECOND SIDE SUBSTANTIALLY PARALLEL TO THE FIRST SIDE, WHEREIN A SUBSTANCE IS DISPOSED ON AT LEAST A PORTION OF THE FIRST SIDE OF THE SUBSTRATE, AT LEAST A PORTION OF THE SECOND SIDE OF THE SUBSTRATE, OR BOTH
202

PROVIDE A SOLUTION THAT INCLUDES AT LEAST ONE AMINE AND A QUATERNARY AMMONIUM HYDROXIDE TO REMOVE AT LEAST A PORTION OF THE SUBSTANCE FROM THE SUBSTRATE
204

CONTACT THE SUBSTRATE WITH THE SOLUTION TO REMOVE AT LEAST A PORTION OF THE SUBSTANCE FROM THE SUBSTRATE
206

FIG. 2

SOLUTIONS AND PROCESSES FOR REMOVING SUBSTANCES FROM SUBSTRATES

BACKGROUND

Various substances, such as polymers, may be used in the manufacture of electronic devices, such as computer chips, memory devices, light emitting diodes (LEDs), and the like. In some cases, these substances may be used to form features on surfaces of substrates (e.g., semiconductor device substrates) included in electronic devices, such as circuit patterns or patterns of bonding articles (e.g. solder bumps). In processing the substrates, these substances may be removed from the surfaces of the substrates. In one example, a layer of a substance may be disposed on at least a portion of the surface of a substrate and at least a portion of the layer may be removed during subsequent processing of the substrates. In another example, the substance may be a residue produced when a particular process is performed on the substrate. In any case, the effectiveness of the removal of the substances from the substrates can affect the quality of the operation of the semiconductor devices.

In an illustrative situation, photoresists and organic-based dielectrics may be used in the manufacture of semiconductor devices included in electronic devices. Photoresists, for example, may be used throughout semiconductor device fabrication in photolithographic operations. After being applied to a surface of a substrate, photoresist may be exposed to actinic radiation through a photomask. For example, a polymeric photoresist can be applied to a substrate as a mask to define the placement of solder onto the substrate. After solder is deposited onto the substrate, the photoresist is removed before the next step in the process can occur. In another example, a polymeric photoresist can be applied to a substrate as an etch mask used to define structures on the substrate that are created in an etch process. After the etch process, there is typically a polymeric or organometallic residue remaining on the substrate that must be removed before the next step in the process can occur.

In some cases, a positive photoresist may be used. Exposure of the positive photoresist to actinic radiation may cause a chemical reaction resulting in a solubility increase in aqueous alkali that allows the positive photoresist to be dissolved and rinsed away with an aqueous alkali developing solution. In other cases, a negative photoresist may be used. When the negative photoresist is exposed to actinic radiation, cross-linking of the polymer may occur in the exposed regions while leaving unexposed regions unchanged. The unexposed regions may be subject to dissolution and rinsing by a suitable developer chemistry. Following development, a resist mask may be left behind. The design and geometry of the resist mask may depend upon the positive or negative tone of the photoresist. Positive tone photoresist may match the design of the photomask, while a negative tone photoresist may provide a pattern that is opposite the photomask design.

Additionally, photoresists are used in the packaging of microelectronic devices. In producing packaging of semiconductor substrates, solder is applied directly to semiconductor substrates that have completed the fabrication of the microelectronic devices but have not been diced into individual chips. A photoresist is used as the mask to define the placement of the solder on the semiconductor substrates. After solder is deposited onto the semiconductor substrates, the photoresist is removed before the next step in the packaging process can occur. The photoresist can be positive or negative. In some cases, the photoresist can be laminated as a dry film onto a surface of the wafer. In other cases, a liquid photoresist can be spin coated or spray coated onto a surface of the wafer.

SUMMARY

The disclosure is directed to solutions and processes to remove substances from substrates. The substances can include photoresist on surfaces of semiconductor substrates, which may also be referred to as "wafers." In particular, the photoresist can include an acrylate-based photoresist. In some scenarios, a semiconductor substrate can include one or more solder bumps. The solder bumps can be free of lead (Pb). Additionally, the semiconductor substrate can include exposed dielectric material. The semiconductor substrate can also include exposed Cu, in some cases. The photoresist can be disposed on one or more surfaces of the semiconductor substrate. Also, the photoresist can be disposed on surfaces of features of the semiconductor substrate. For example, the photoresist can be disposed on solder bumps of the semiconductor substrate. In another example, the photoresist can be disposed on one or more copper-containing surfaces of the semiconductor substrate. Furthermore, the photoresist can be disposed on one or more dielectric surfaces of the semiconductor substrate.

A solution used to remove one or more substances from a substrate can include a first amine, a second amine, and a third amine. The solution can also include a quaternary ammonium hydroxide.

Additionally, a solution used to remove one or more substances from a substrate can include at least one amine and a quaternary ammonium hydroxide. The solution can also include water and be free of a polar solvent other than water.

Further, a process to remove one or more substances from a substrate can include providing a substrate including a first side and a second side substantially parallel to the first side. A substance can be disposed on at least a portion of the first side of the substrate, at least a portion of the second side of the substrate, or both. The process can also include contacting the substrate with a solution that includes a first amine, a second amine, a third amine, and a quaternary ammonium hydroxide.

In some cases, a total amount of amine in the solution includes an amount of the first amine, an amount of the second amine, and an amount of the third amine with the total amount of amine being no greater than about 95% by weight of a total weight of the solution. Additionally, the solution can include water. Further, the solution can include an amide. In some instances, the viscosity of the solution can be no greater than about 60 centipoise.

Optionally, a solution used to remove one or more substances from a substrate can include at least one amine. For example, the solution can include a plurality of amines. To illustrate, the solution can include a first amine, a second amine, and a third amine. The first amine can be an aliphatic amine. Additionally, the second amine can be an alkanolamine. Further, the third amine can be an aromatic amine. The solution can also include a quaternary ammonium hydroxide and water. Optionally, the solution can be free of a polar solvent other than water.

One or more surfaces of a substrate can be contacted with the solution to remove one or more substances from the substrate. For example, the substrate can be contacted with the solution to remove photoresist from the one or more surfaces of the substrate. The substrate can be contacted with the solution at temperature of at least about 60° C. for a duration of at least about 10 minutes.

DETAILED DESCRIPTION

This disclosure describes solutions and processes to remove substances from substrates. When the substance is in contact with the solution, the substance may be released from a surface of the substrate. In particular instances, one or more sides of the substrate can be contacted by the solution. Optionally, one or more substrates can be immersed in the solution. Additionally, the solution can be dispensed onto at least one surface of one or more substrates to remove at least one substance from the substrate. For example, the solution can be sprayed onto one or more surfaces of the substrate to remove at least one substance from the one or more surfaces of the substrate.

Processes described herein may be utilized to remove substances from substrates, such as microelectronic wafers, flat panel displays, LEDs, and so forth. In particular, the techniques described herein can be used to remove photoresist from semiconductor substrates. The photoresist may be removed in conjunction with packaging operations of semiconductor substrates. Furthermore, by using solutions and processes described in accordance with implementations describe herein, the efficient removal of targeted substances from substrates can be accomplished with minimal impact to other substances on the substrates. For example, in the removal of photoresist from a substrate according to examples described herein, any corrosion of copper or solder included on the substrate can be minimized or eliminated. Additionally, any corrosion or other damage to a material of the substrate, such as Si, can be minimized or eliminated.

The photoresist can be deposited onto a dielectric material where the adhesion between the photoresist and the dielectric is strong enough to make removal of the photoresist difficult. Additionally, patterning and processing of the photoresist using one or more thermal processes can also add to the difficulty in removal of the photoresist from a semiconductor substrate. Photoresist can be removed from surfaces on a semiconductor substrate via a number of mechanisms, such as (1) swelling and lifting of the photoresist from a surface of the substrate, (2) dissolving of the photoresist by a stripping solution penetrating into the photoresist and carrying along compounds that react with the photoresist and break it down, and/or (3) use of interfacial interactions, which require points of access for a stripping solution between the photoresist and the underlying substrate. Typically the points of access between the photoresist and the underlying substrate are found at the edge of the substrate and at the boundaries of patterned features on the substrate. The contribution from each mechanistic pathway may vary by changing the formulation of the stripping solution, the process conditions, and/or materials of the substrate. Changing these factors may allow for selection of a particular mechanism for removal of a substance from a substrate.

The above-described mechanisms for removal of substances from substrates also benefit from the formulations of solutions having good wettability of the various surfaces of the substrate and a robust rinsing process. Some mechanisms are better suited to certain cleaning tool types. For example, a swell and lift mechanism can benefit from the use of physical forces, such as from a spray tool, to decrease strip process time. Mechanisms such as dissolving type, are suitable for any cleaning tool type, whether immersion-based or spray tool based, whether single wafer tool or batch tool. Resist removal which is predominantly accomplished using interfacial interactions, may benefit from immersion or immersion-like processes which allow for a sufficient amount of a stripping solution to be applied to a substance disposed on a substrate and sufficient time for the stripping solution to penetrate to exposed interfaces.

Examples of solutions and process for resist removal are described herein where a photoresist removal mechanism is swell and lift. In particular, contact can be made between the stripping solution and a top surface of the photoresist as well as at edges of the photoresist and, in cases where the substrate is patterned, contact also can be made at the boundary between a feature and the photoresist. As a result, an amount of the photoresist separated from a surface of the substrate is maximized. Additionally, solutions described herein can modify the interfacial interactions between features disposed on a substrate and a surface of the substrate. Thus, the photoresist can be removed faster from areas where there is a high density of features and more slowly from areas where there is a lower density of features.

The term "coating" is defined as a method for applying a film to a substrate such as spray coating, puddle coating, or slit coating. The term "release" or "releasing" relates to removal of the substance from the substrate and is defined to include dissolution of the substance. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the composition, unless otherwise indicated. Further, when an object or solution is described as being "free" of a material, the object or solution does not include any amount of the material other than, in some cases, a possible residual amount of the material that is an impurity.

Figure 1:
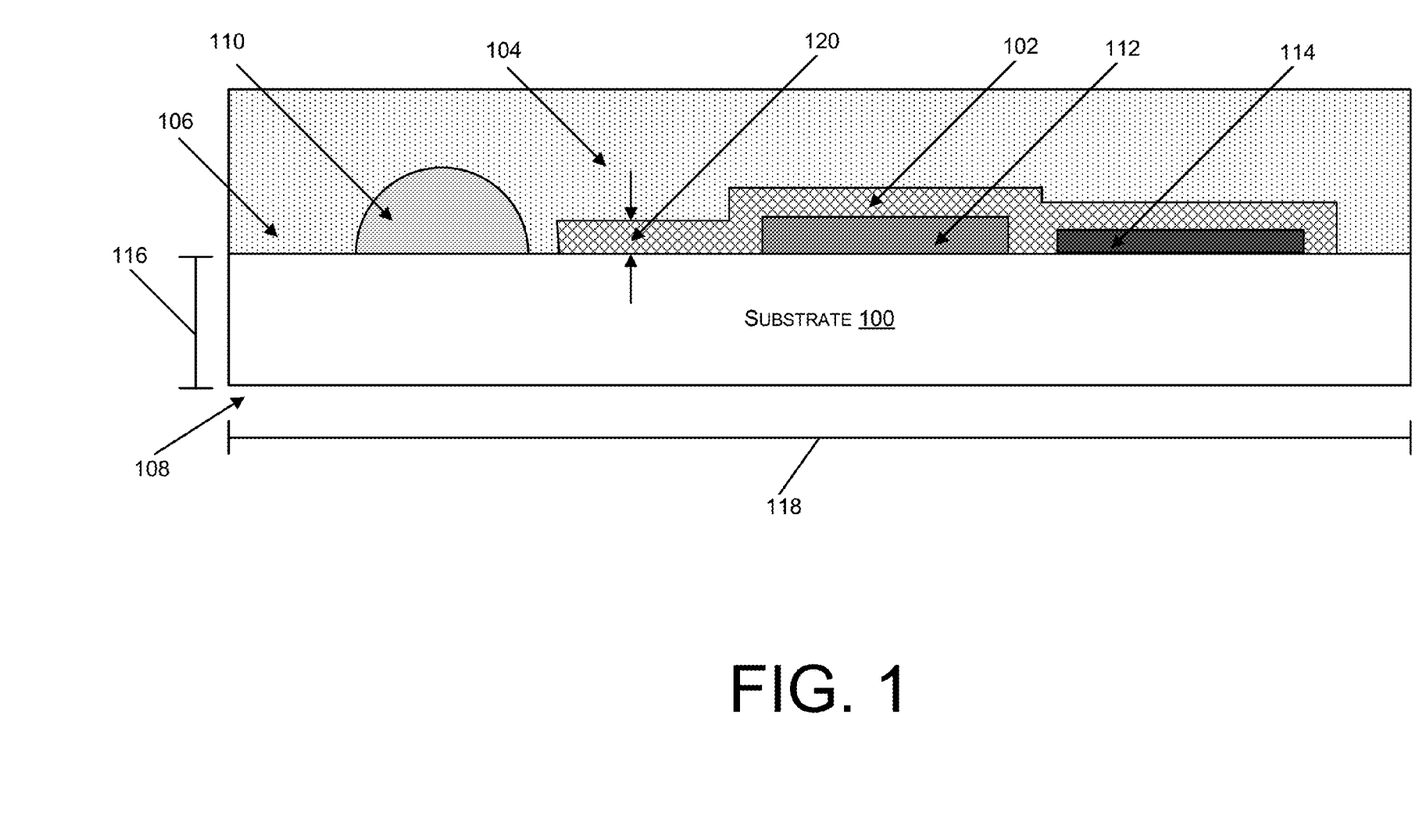
FIG. 1 is an illustration of a substrate having a substance on one or more surfaces of the substrate and a solution that is in contact with the substrate.

FIG. 1 is an illustration of a substrate 100 having a substance 102 on one or more surfaces of the substrate 100 and a solution 104 that is in contact with the substance 102 and the substrate 100. The substrate 100 can include a first side 106 and a second side 108. The second side 108 can be substantially parallel to the first side 106. Features can be formed on the first side 106, the second side 108, or both. For example, the substrate 100 can include one or more bonding articles, such as a solder bump 110, formed on the first side 106 that can be used to bond the substrate 100 to an additional substrate (not shown). Additionally, the substrate 100 can include features of circuit patterns, such as a copper feature 112 formed on the first side 106.

Further, the substrate 100 can include one or more dielectric materials, such as representative dielectric material 114. The dielectric material 114 can include a polymeric material. The dielectric material 114 can also include an oxide, nitride or oxynitride of silicon (Si). In addition, the dielectric material 114 can include at least one fluorosilicate glass. Also, the dielectric material 114 can include carbon and oxygen containing materials such as epoxies and polybenzoxazoles (PBOs), and carbon, nitrogen and oxygen containing materials such as polyimides (PIs). Optionally, the dielectric material 114 can include hybrid materials of Si-doped organic dielectric materials or organic doped silicon-based dielectric materials.

Although, no features are shown in FIG. 1 as being formed on the second side 108, a number of solder bumps, a number of copper features, dielectric materials, or combinations thereof, can be formed on the second side 108. Further, although a single solder bump 110, a single copper feature 112, and a single layer of dielectric material 114 are shown on the first side 106 in FIG. 1, any number of solder bumps, copper features, or layers of dielectric materials can be formed on the first side 106. In some cases, the solder bump 110, the copper feature 112, the dielectric material 114, or combinations thereof, can be part of a pattern of features formed on the first side 106.

The substrate 100 can include an inorganic material. For example, the substrate 100 can include a semiconductor material. To illustrate, the substrate 100 can include silicon, silicon dioxide, or a combination thereof. Optionally, the substrate 100 can include a semiconductor material and also include dopant materials, such as boron (B), gallium (Ga), arsenic (As), phosphorus (P), or combinations thereof. Additionally, the substrate 100 can include organic materials, such as one or more polymeric materials. For example, the substrate 100 can include a polyimide or other dielectric polymeric materials. Further, the substrate 100 can include one or more layers, such as one or more core layers, one or more reinforcing layers, one or more insulating layers, one or more metal layers, or a combination thereof.

Surfaces of the substrate 100 can be circular in shape. Alternatively, surfaces of the substrate 100 can be planar in shape, such as rectangular or square-shaped. Additionally, the substrate 100 can have one or more dimensions defining a surface area of the substrate 100, such as radius, diameter, length, width, or combinations thereof. The substrate 100 can also have a thickness 116. The thickness 116 of the substrate 100 can include the thickness of one or more layers of the substrate 100. The thickness 116 of the substrate 100 can be in a range of about 250 micrometers to about 950 micrometers, in a range of about 500 micrometers to about 800 micrometers, or in a range of about 700 micrometers to about 780 micrometers. Further, a width or a diameter 118 of the substrate 100 can be in a range of about 50 mm to about 450 mm, in a range of about 200 mm to about 300 mm, or in a range of about 200 mm to about 450 mm.

Optionally, the substrate 100 can be thinner. For example, substrates can be thinned to enable stacking of substrates into one single package. The thickness of thin substrates can be in a range of 20 micrometers to 100 micrometers, or in a range from 25 micrometers to 75 micrometers. The thin substrate can be supported on a carrier (not shown in FIG. 1) and attached to the carrier by an adhesive. The carrier and the adhesive are temporary supports from which the thin substrate can be removed. During processing of the thin substrate while attached to the carrier, the thickness of the carrier and thin substrate combination can be included in a range of about 700 mm to about 900 mm.

The substance 102 can be disposed as a layer covering at least a portion of a particular side of the substrate 100. Optionally, the substance 102 can at least partially cover one or more features formed on the substrate 100. The substance 102 can be disposed on portions of the particular side of the substrate 100, while other portions of the particular side of the substrate 100 are free from the substance 102. For instance, in the illustrative example of FIG. 1, the substance 102 is disposed on the copper feature 112 and a portion of the first side 106 is covered by the substance 102, while an additional portion of the first side 106 is free of the substance 102. The substance 102 is also disposed over the dielectric material 114. The substance 102 can be disposed on a particular side of the substrate 100 according to a pattern. Although, the substance 102 is shown as being disposed on the first side 106 of the substrate 100, the substance 102 can also be disposed on the second side 108 of the substrate 100, in other situations. Furthermore, although FIG. 1 shows the substance 102 being disposed on the copper feature 112 and the dielectric material 114 and the solder bump 110 being free of the substance 102, optionally, the substance 102 can be disposed on at least a portion of the solder bump 110 and at least a portion of the copper feature 112 and at least a portion of the dielectric material 114 can be free of the substance 102.

The substance 102 can have a thickness 120. The thickness 120 of the substance 102 can be substantially uniform. Alternatively, the thickness 120 of the substance 102 disposed on the substrate 100 can vary. The thickness 120 of the substance 102 disposed on the substrate 100 can be no greater than about 300 micrometers, or no greater than about 250 micrometers, or no greater than about 200 micrometers, or no greater than about 150 micrometers, or no greater than about 100 micrometers. In addition, the thickness 120 of the substance 102 on the substrate 100 can be at least about 0.5 micrometers, or at least about 5 micrometers, or at least about 10 micrometers, or at least about 25 micrometers, or at least about 40 micrometers, or at least about 60 micrometers. In an illustrative example, the thickness 120 of the substance 102 on the substrate 100 can be included in a range of about 0.25 micrometers to about 300 micrometers. In another illustrative example, the thickness 120 of the substance 102 on the substrate 100 can be included in a range of about 8 micrometers to about 125 micrometers. In a further illustrative example, the thickness 120 of the substance 102 on the substrate 100 can be included in a range of about 20 micrometers to about 80 micrometers.

In some cases, the substance 102 can include photoresist. The photoresist can be a negative photoresist. Alternatively, the photoresist can be a positive photoresist. The photoresist may have been subjected to one or more rinsing processes, one or more curing processes, one or more pre-treatment processes, or a combination thereof. For example, the photoresist may have been exposed to electromagnetic radiation, such as ultraviolet light. The photoresist can include an acrylate polymer. In one example, the photoresist can be applied as a dry film to the substrate 100. To illustrate, the photoresist can be laminated on at least a portion of the substrate 100. In another example, the photoresist can be coated onto the substrate 100 as a liquid. In particular, the photoresist can be applied to at least portion of the substrate 100 using a spin coating process or a spray coating process.

The solution 104 can include a stripping solution to remove a targeted substance from at least a portion of the substrate 100 and/or cause the targeted substance to be released from the substrate 100. For example, the solution 104 can cause at least a portion of the substance 102 to be removed from the substrate 100. The solution 104 can be homogeneous. As used herein, a solution can be referred to as being "homogenous" when the solution maintains a single phase at about 23° C. for at least 24 hours. Solutions that are homogeneous can be more effective at removing the substance 102 from the substrate 100 than solutions that are inhomogeneous. As used herein, a solution can be referred to as being "inhomogeneous" when the solution has multiple phases at about 23° C. before a 24 hour time period has elapsed after mixing of the solution. Thus, the solution 104 has formulations that cause the solution 104 to be homogeneous.

The solution 104 can include at least one amine. The at least one amine can include at least one of an aliphatic amine, an alkanolamine, an aromatic amine, or a combination thereof. Optionally, the solution 104 can include a plurality of amines. For example, the solution 104 can include a first amine, a second amine, and a third amine. In an illustrative example, the plurality of amines can include at least one aliphatic amine. Additionally, the plurality of amines can include at least one alkanolamine. Further, the plurality of amines can include at least one aromatic amine. In a particular example, the solution 104 can include an aliphatic amine, an alkanolamine, and an aromatic amine. The solution 104 can also include less than three amines, such as one amine or two amines, or more than three amines, such four amines, five amines, or greater than five amines.

An aliphatic amine can include a nitrogen (N) containing compound where an aromatic ring is not directly bonded to a nitrogen atom of the compound. For example, an aliphatic amine can have one or more lower alkyl groups directly bonded to a nitrogen atom of the compound. The term "lower alkyl" can refer to a functional group including a straight-chain or branched-chain hydrocarbon containing from 1 to 20 carbon atoms linked exclusively by single bonds and not having any cyclic structure. Examples of lower alkyl groups include methyl, ethyl, n-propyl, isopropyl, n-butyl, isobutyl, sec-butyl, tert-butyl, pentyl, iso-amyl, hexyl, heptyl, octyl, nonyl, decyl, undecyl, dodecyl tridecyl, tetradecyl, pentadecyl, hexadecyl, heptadecyl, octadecyl, nonadecyl, eicosyl, and the like. Examples of aliphatic amines included in the solution 104 include, but are not limited to tetraethylpentamine (TEPA), triethylenetetramine (TETA), diethylenetriamine (DETA), dimethyldodecylamine, dimethyltetradecylamine, or combinations thereof.

An alkanolamine can include a hydroxyl group and an amino group. The hydroxyl group and the amino group can be bonded to a straight chain or a branched chain of carbon atoms. Optionally, an alkanolamine can have at least two carbon atoms and have the amino group and the hydroxyl group bonded to different carbon atoms. For example, an alkanolamine included in the solution 104 can include a 1, 2 alkanolamine having the formula:

where $R_1$ and $R_2$ are individually hydrogen, $(C_1-C_4)$ alkyl, or $(C_1-C_4)$ alkylamino.

Examples of alkanolamines included in the solution 104 include, but are not limited to, aminoethylethanolamine, dimethylaminoethanol, monoethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, 2-(2-aminoethoxy)ethanol, and mixtures thereof.

An aromatic amine can include an amino group bonded to a substituted or an unsubstituted aromatic ring. The aromatic ring can have an aryl ring structure or a heteroaryl ring structure. Examples of aromatic amines included in the solution 104 include but are not limited to, benzyl amine, dimethylbenzyl amine, pyridine, phenethylamine, and mixtures thereof.

A total amount of the at least one amine in the solution 104 can include an amount of each individual amine included in the solution 104. For example, when the solution 104 includes two amines, a total amount of amines in the solution 104 can include an amount of a first amine and an amount of a second amine. In another example, when the solution 104 includes three amines, a total amount of amines in the solution 104 can include an amount of a first amine, an amount of a second amine, and an amount of a third amine. In an additional example, when the solution 104 includes four amines, a total amount of amines in the solution 104 can include an amount of a first amine, an amount of a second amine, an amount of a third amine, and an amount of a fourth amine. In a further example, when the solution 104 includes five amines, a total amount of amines in the solution 104 can include an amount of a first amine, an amount of a second amine, an amount of a third amine, an amount of a fourth amine, and an amount of a fifth amine.

A total amount of any amine in the solution 104 can be no greater than about 97%, or no greater than about 95%, or no greater than about 93%, or no greater than about 90%, or no greater than about 85%, or no greater than about 80%, or no greater than about 75%, in each case as weight based on the total weight of the solution 104. In addition, the total amount of amines in the solution 104 can be at least about 50%, or at least about 55%, or at least about 60%, or at least about 65%, or at least about 70%, in each case as weight % based on the total weight of the solution 104. In an illustrative example, a total amount of amines in the solution 104 can be included in a range of about 45% by weight to about 98% by weight for a total weight of the solution 104. In another illustrative example, a total amount of amines in the solution 104 can be included in a range of about 67% by weight to about 97% by weight for a total weight of the solution 104. In an additional illustrative example, a total amount of amines in the solution 104 can be included in a range of about 82% by weight to about 96% by weight for a total weight of the solution 104.

An amount of each individual amine included in the solution 104 can be no greater than about 97%, or no greater than about 95%, or no greater than about 90%, or no greater than about 80%, or no greater than about 70%, or no greater than about 60% in each case as weight % based on the total weight of the solution 104. Also, an amount of each individual amine included in the solution 104 can be at least about 2%, or at least about 5%, or at least about 10%, or at least about 20%, or at least about 30%, or at least about 40%, or at least about 50% in each case as weight % based on the total weight of the solution 104.

In an illustrative example, an amount of each individual amine included in the solution 104 can be included in a range of about 1% by weight to about 98% by weight for a total weight of the solution 104. In another illustrative example, an amount of each individual amine included in the solution 104 can be included in a range of about 2% by weight to about 10% by weight for a total weight of the solution 104. In an additional illustrative example, an amount of each individual amine included in the solution 104 can be included in a range of about 5% by weight to about 30% by weight of a total weight of the solution 104. In a further illustrative example, an amount of each individual amine included in the solution 104 can be included in a range of about 22% by weight to about 42% by weight of a total weight of the solution 104. In still another illustrative example, an amount of each individual amine included in the solution 104 can be included in a range of about 25% by weight to about 55% by weight of a total weight of the solution. In still additional examples, an amount of each individual amine included in the solution 104 can be included in a range of about 30% by weight to about 40% by weight of a total weight of the solution 104. In still further examples, an amount of each individual amine included in the solution 104 can be included in a range of about 40% by weight to about 55% by weight of a total weight of the solution 104.

Other suitable ranges for an amount of each individual amine in the solution 104 include 1-98, or 2-98, or 5-98, or 20-98, or 30-98, or 50-98, or 50-98, or 1-97, or 2-97, or 5-97, or 20-97, or 30-97, or 50-97, or 50-95, or 1-95, or 2-95, or 5-95, or 20-95, or 30-95, or 50-95, or 50-90, or 1-90, or 2-90, or 5-90, or 20-90, or 30-90, or 50-90, or 50-80, or 1-80, or 2-80, or 5-80, or 20-80, or 30-80, or 50-80, or 50-70, or 1-70, or 2-70, or 5-70, or 20-70, or 30-70, or 50-70, or 50-60, or 1-60, or 2-60, or 5-60, or 20-60, or 30-60, or 50-60, in each case as wt. % based on the total weight of the solution 104.

In some illustrative examples, the solution 104 can include an amount of at least one aliphatic amine. For example, the solution 104 can include an amount of aliphatic amine included in a range of about 20% by weight to about 95% by weight of a total weight of the solution 104. The solution 104 can also include an amount of aliphatic amine included in a range of about 25% by weight to about 45% by weight of a total weight of the solution 104. Additionally, the solution 104 can include an amount of aliphatic amine included in a range of about 38% by weight to about 58% by weight of a total weight of the solution 104. In some instances, the solution 104 can be free of an aliphatic amine.

The solution 104 can include an amount of at least one alkanolamine. To illustrate, the solution 104 can an include an amount of alkanolamine included in a range of about 2% by weight to about 90% by weight of a total weight of the solution 104. In other instances, the solution 104 can include an amount of alkanolamine included in a range of about 10% by weight to about 40% by weight of a total weight of the solution 104. In addition, the solution 104 can include an amount of alkanolamine included in a range of about 22% by weight to about 37% by weight of a total weight of the solution 104. Further, the solution 104 can be free of an alkanolamine, in some cases.

The solution 104 can include an amount of at least one aromatic amine. The solution 104 can include an amount of aromatic amine included in a range of about 2% by weight to about 35% by weight of a total weight of the solution 104. The solution 104 can also include an amount of aromatic amine included in a range of about 3% by weight to about 10% by weight of a total weight of the solution 104. Additionally, the solution 104 can include an amount of aromatic amine that is included in a range of about 18% by weight to about 32% by weight of a total weight of the solution 104. The solution 104 can be free of an aromatic amine, in some cases.

Additionally, the solution 104 can include an amount of at least one quaternary ammonium hydroxide. The quaternary groups can include (C1-C8) alkyl, aryl alkyl, and combinations thereof. The at least one quaternary ammonium hydroxide can include tetramethylammonium hydroxide (TMAH), tetraethylammonium hydroxide (TEAH), dimethyldipropylammonium hydroxide (DMDPAH), trimethylethylammonium hydroxide (TMEAH), benzyltrimethylammonium hydroxide (BTMAH), tetrapropylammonium hydroxide (TPAH), tetrabutylammonium hydroxide (TBAH), or a mixture thereof. In an illustrative example, the solution 104 can include an amount of quaternary ammonium hydroxide included in a range of about 0.5% by weight to about 10% by weight of a total weight of the solution 104. In another illustrative example, an amount of quaternary ammonium hydroxide included in the solution 104 can be included in a range of about 1% by weight to about 5% by weight of a total weight of the solution 104.

The solution 104 can also include an amount of water. For example, the solution 104 can include an amount of water included in a range of about 0.5% by weight to about 10% by weight of a total weight of the solution 104. In another example, the solution 104 can include an amount of water included in a range of about 1% by weight to about 5% by weight of a total weight of the solution 104.

In addition, the solution 104 can include an amount of at least one polar solvent other than water. The at least one polar solvent can include a solvent that solvates components of the substance 102. For example, the at least one polar solvent can solvate polymer chains of the substance 102 when the substance 102 includes a photoresist. The at least one polar solvent can also include a solvent that delivers components of the solution 104 that are intended to react with components of the substance 102. To illustrate, when the substance 102 includes a photoresist, the at least one polar solvent can deliver components of the solution 104, such as one or more amines, to functional groups on the polymer chains of the photoresist. In addition, the at least one polar solvent can provide stability to the solution 104 and maintain the homogeneity of the solution 104. In an example, the at least one polar solvent can aid in dissolving a quaternary ammonium hydroxide included in the solution 104. Further, the at least one polar solvent can have minimal or no involvement in decomposition reactions of the substance 102 when the solution 104 contacts the substance 102. In an illustrative example, when the substance 102 includes a photoresist, the at least one polar solvent can have minimal or no involvement in decomposition reactions of the polymer chains of the photoresist. In a particular example, the at least one polar solvent other than water does not include an amine.

Optionally, the at least one polar solvent can include glycols, polyglycols, glycol ethers, or combinations thereof. In an example, the at least one polar solvent can include an alcohol. In another example, the at least one polar solvent can include a diol. Additionally, the at least one polar solvent can include a polar protic solvent. The at least one polar solvent other than water can include 3-methoxy 3-methyl 1-butanol, 3-methoxy 3-methyl 2-butanol, 3-methoxy-3-methyl-4-butanol, ethylene glycol, propylene glycol, 1,3-butanediol, 1,4-butanediol, 1,2 pentanediol, 1,3-pentanediol, 1,4-pentanediol, 1,5-pentanediol, 2,3-pentanediol, 1,2- hexanediol, 1,3-hexanediol, 1,4-hexanediol, 1,5-hexanediol, 1,6-hexanediol, 2,3-hexanediol, 2,4-hexanediol, 3,4-hexanediol, diethyleneglycol, triethylene glycol, tetraethyleneglycol, triethylene glycol monomethylether, triethylene glycol monoethylether, triethylene glycol monobutylether, triethylene glycol dimethylether, triethylene glycol diethylether, triethylene glycol dibutylether, butylene glycol monomethylether, butylene glycol monoethylether, butylene glycol monobutyl ether, butylene glycol dimethylether, butylene glycol diethylether, butylene glycol dibutyl ether, tetrahydrofurfuryl alcohol, cyclohexanol, benzyl alcohol, furfuryl alcohol, diethylene glycol monobutyl ether, diethylene glycol monoethyl ether, diethylene glycol monomethyl ether, diethylene glycol dibutyl ether, diethylene glycol diethyl ether, diethylene glycol dimethyl ether, (4-methylcyclohexyl)methanol, hydroxymethylcyclohexane, m-cresol, tert-butyl alcohol, tert-amyl alcohol, 3-methyl-3-pentanol, 1-octanol, 1-decanol, 1-undecanol, 1-dodecanol, 1-tridecanol, 1-tetradecanol, 1-pentadecanol, 1-hexadecanol, 9-hexadecen-1-ol, 1-heptadecanol, 1-octadecanol, 1-nonadecanol, 1-eicosanol, 1-heneicosanol, 1-docosanol, 1,3-docosen-1-ol, 1-tetracosanol, 1-hexacosanol, 1-heptacosanol, 1-octacosanol, 1-triacontanol, 1-dotriacontanol, 1-tetratriacontanol, cetearyl alcohol, or mixtures thereof.

The solution 104 may contain a solvent of the structure ROH. In an example, R can be an optionally substituted aliphatic group having a carbon chain including 1 to 20 carbon atoms. In an illustrative example, the solvent can include butanol. The aliphatic group can include at least one optionally substituted aromatic substituent. Optionally, the solvent can comprise an aliphatic diol or aliphatic polyol having an optionally substituted carbon chain including 1 to 20 carbon atoms. To illustrate, the solvent can include 1,2 butanediol. In another example, the solvent can include a sugar alcohol, such as sorbitol or xylitol. Additionally, the solvent can include an aromatic diol, such as catechol or resorcinol. Further, the solvent can include a glycol. In an example, the solvent can include butylene glycol. Optionally the solvent can include an optionally substituted aliphatic glycol ether having a structure of R3-O—R4-OH, where R3 and R4 individually include an optionally substituted carbon chain having 1 to 20 carbon atoms. Also, R3 or R4 can include an optionally substituted aromatic group, such that the solvent includes an aromatic glycol ether. In an illustrative example, the solvent can include ethylene glycol phenyl ether. In addition, the solvent can include a di-ether having a structure of R5-O—R6-O—R7-O—R8, where R5 and R8 individually include H or an optionally substituted carbon chain having 1 to 20 carbon atoms and R6 and R7 include an optionally substituted carbon chain having 1 to 20 carbon atoms. For example, the solvent can include diethyleneglycol dimethylether. Any substituents of the carbon chains of the solvent included in the solution 104 can include H, OH, an alkyl group including 1 to 10 carbon atoms, an alkenyl group including 1 to 10 carbon atoms, an alkynyl group including 1 to 10 carbon atoms, an optionally substituted amino group, an optionally substituted aryl group, an optionally substituted heteroaryl group, an optionally substituted cycloalkyl group, or combinations thereof.

In an illustrative example, an amount of polar solvent other than water included in the solution 104 can be included in a range of about 0.5% by weight to about 30% by weight of a total weight of the solution 104. In another illustrative example, an amount of polar solvent other than water included in the solution 104 can be included in a range of about 1% by weight to about 12% by weight of a total weight of the solution 104. The solution 104 can also be free of a polar solvent other than water, in some instances.

Further, the solution 104 can include an amount of at least one amide. The at least one amide can reduce the viscosity of the solution 104. Reducing the viscosity of the solution 104 can improve the efficiency of processes that utilize the solution 104, reduce maintenance on apparatuses that utilized the solution 104, or both. Optionally, the at least one amide can include a dimethyl amide having the formula:

where $R_8$ is $(C_1-C_9)$ alkyl, or $(C_1-C_9)$ alkene.

Amides included in the solution 104 include, but are not limited to, N,N-dimethyl 9-decenamide (DMDA), N,N-dimethyldecanamide (DMDAA), dimethylacetamide (DMAC), or mixtures thereof. In an illustrative example, the solution 104 can include an amount of amide included in a range of about 1% by weight to about 55% by weight of a total weight of the solution 104. In another illustrative example, the solution 104 can include an amount of amide included in a range of about 10% by weight to about 40% by weight of a total weight of the solution 104. In another illustrative example, the solution 104 can include an amount of amide included in a range of about 20% by weight to about 30% by weight of a total weight of the solution 104. Optionally, the solution 104 can be free of an amide.

In some examples, the solution 104 can have a viscosity of no greater than about 70 centipoise (cP), or no greater than about 60 cP, or no greater than about 50 cP, or no greater than about 40 cP, or no greater than about 30 cP. Additionally, the solution 104 can have a viscosity of at least about 5 cP, or at least about 15 cP, or at least about 25 cP, or at least about 35 cP. In an illustrative example, the solution 104 can have a viscosity included in a range of about 10 cP to about 60 cP. In another illustrative example, the solution 104 can have a viscosity included in a range of about 30 cP to about 55 cP. In an additional illustrative example, the solution 104 can have a viscosity included in a range of about 10 cP to about 25 cP. The viscosity of the solution 104 can refer to the dynamic viscosity of the solution 104. The viscosity of the solution 104 can be measured by measuring the kinematic viscosity following the ASTM method D445 at the time of filing of this application using Ubbelohde capillary viscometers in a water bath at 25° C. The dynamic viscosity (measured in cP) can be calculated by multiplying the kinematic viscosity (measured in cSt) by the solution density. The solution density was estimated by calculating the weight average density of the components of the solution.

The solution 104 can include an amount of an aliphatic amine, such as TEPA, included in a range of about 40% by weight to about 60% by weight of a total weight of the solution 104; an amount of an alkanolamine, such as MEA, included in a range of about 30% by weight to about 40% by weight of a total weight of the solution 104; and an amount of an aromatic amine, such as a benzyl amine, included in a range of about 3% by weight to about 25% by weight of a total weight of the solution 104. The solution 104 can also include an amount of a quaternary ammonium hydroxide, such as TMAH, included in a range of about 1% by weight to about 5% by weight of a total weight of the solution 104 and an amount of water included in a range of about 1% by weight to about 5% by weight of a total weight of the solution 104. Further, the solution 104 can be free of a polar solvent other than water.

The solution 104 can also include an amount of an aliphatic amine, such as TEPA, included in a range of about 40% by weight to about 60% by weight of a total weight of the solution 104; an amount of an alkanolamine, such as MEA, included in a range of about 30% by weight to about 40% by weight of a total weight of the solution 104; and an amount of an aromatic amine, such as a benzyl amine, included in a range of about 3% by weight to about 25% by weight of a total weight of the solution 104. In addition, the solution 104 can include an amount of a quaternary ammonium hydroxide, such as TMAH, included in a range of about 1% by weight to about 5% by weight of a total weight of the solution 104; an amount of water included in a range of about 1% by weight to about 5% by weight of a total weight of the solution 104; and an amount of a polar solvent other than water, such as MMB, included in a range of about 0.5% by weight to about 12% by weight of a total weight of the solution 104. Further, the solution 104 can have a viscosity included in a range of about 40 cP to about 60 cP.

Optionally, the solution 104 can include an amount of an aliphatic amine, such as TEPA, included in a range of about 35% by weight to about 45% by weight of a total weight of the solution 104; an amount of an alkanolamine, such as MEA, included in a range of about 20% by weight to about 30% by weight of a total weight of the solution 104; and an amount of an aromatic amine, such as a benzyl amine, included in a range of about 1% by weight to about 10% by weight of a total weight of the solution 104. The solution 104 can also include an amount of a quaternary ammonium hydroxide, such as TMAH, included in a range of about 1% by weight to about 5% by weight of a total weight of the solution 104; an amount of water included in a range of about 1% by weight to about 5% by weight of a total weight of the solution 104; an amount of a polar solvent other than water, such as MMB, included in a range of about 0.5% by weight to about 5% by weight of a total weight of the solution 104; and an amount of an amide, such as DMDA or DMAC, included in a range of about 20% by weight to about 30% by weight of a total weight of the solution 104. Further, the solution 104 can have a viscosity included in a range of about 10 cP to about 25 cP.

Figure 2:
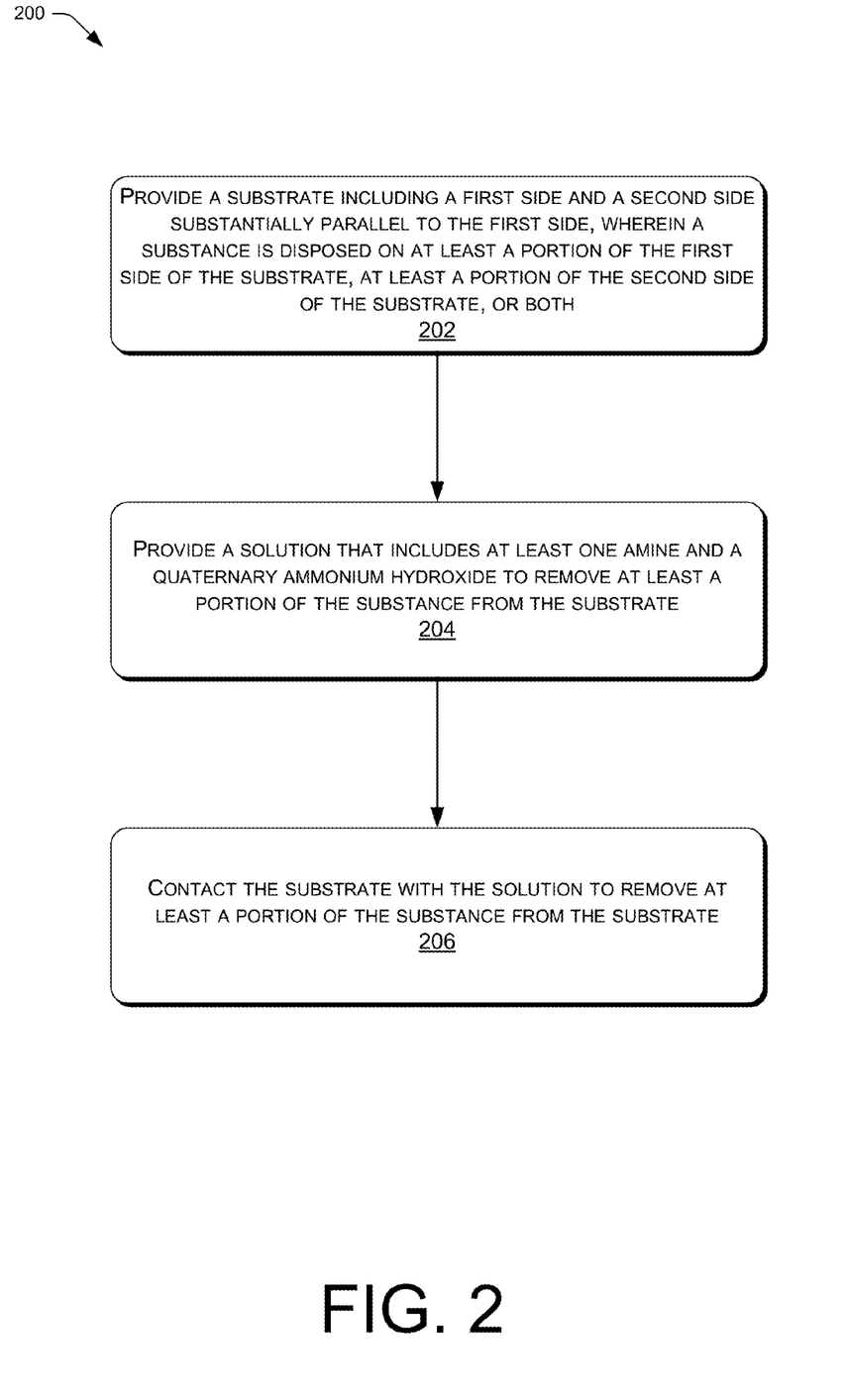
FIG. 2 is a flow diagram of an example process to remove substances from substrates.

FIG. 2 is a flow diagram of an example process 200 to remove a targeted substance that is disposed on a substrate, such as the substance 102 disposed on the substrate 100 of FIG. 1.

At 202, the process 200 includes providing a substrate including a first side and a second side substantially parallel to the first side. The substance can be disposed on the first side of the substrate, the second side of the substrate, or both. In some cases, the substance can be disposed on one or more features formed on a side of the substrate, such as one or more solder bumps, one or more copper features, or a combination thereof.

The substance can include a photoresist. Optionally, the photoresist can be applied to one or more portions of the substrate by laminating a dry film including the photoresist onto the one or more portions of the substrate. Also, the photoresist can be applied to one or more portions of the substrate as a liquid in a spin coating process or a spray coating process. After the photoresist is applied to the one or more portions of the substrate, the photoresist may have been exposed to actinic radiation, such as ultraviolet radiation.

At 204, the process 200 includes providing a solution to remove one or more substances from the substrate. The solution can include one or more of the formulations of solutions described with respect to the solution 104 of FIG. 1. In one example, the solution can include a first amine, a second amine, a third amine, and a quaternary ammonium hydroxide. In another example, the solution can include at least one amine, a quaternary ammonium hydroxide, water, and be free of a polar solvent other than water. Optionally, the solution can include an aliphatic amine and have an amount of the aliphatic amine that is at least about 35% by weight of a total weight of the solution. Additionally, the solution can include an alkanolamine and have an amount of the alkanolamine that is at least about 15% by weight of a total weight of the solution. Further, the solution can include an aromatic amine and have an amount of an aromatic amine that is no greater than about 30% by weight of a total weight of the solution.

The solution can also include an amount of a quaternary ammonium hydroxide that is no greater than about 8% by weight of a total weight of the solution. In addition, the solution can include an amount of water that is no greater than about 8% by weight of a total weight of the solution. Optionally, the solution can include a polar protic solvent other than water and include an amount of the polar protic solvent that is no greater than about 25% by weight of a total weight of the solution. Thus, in some examples, the solution can include an amount of a polar solvent other than water, but in other formulations, the solution can be free of a polar solvent other than water. Furthermore, the solution can include an amount of an amide that is no greater than about 50% by weight of a total weight of the solution.

Additionally, the solution can have a viscosity that is no greater than about 50 cP. The solution can also have a viscosity that is no greater than about 30 cP. Optionally, a solution having a viscosity no greater than about 30 cP can be utilized in the process 200 to minimize problems encountered by some machinery during the processing of the substrate and the solution.

At 206, the process 200 includes contacting the substrate with a solution to remove at least a portion of one or more substances disposed on the substrate. Optionally, one or more sides of the substrate can be contacted by the solution. The solution can dissolve a targeted substance (e.g., photoresist) that is disposed on the substrate and/or cause the targeted substance to be released from the substrate. To illustrate, the solution can dissolve a targeted substance through one or more decomposition reactions. The substrate can be processed along with one or more additional substrates, and the process 200 can be utilized to remove substances from multiple substrates.

In particular, the solution can remove at least about 75% of the targeted substance from the substrate, or at least about 85% of the targeted substance from the substrate, or at least about 95% of the targeted substance from the substrate, or at least about 99% of the targeted substance from the substrate. Additionally, the solution can remove substantially all of the substance from the substrate.

Contacting the substance on the substrate with the solution can also include heating the solution, the substrate, or both to a temperature that provides for the removal of the substance within a specified period of time. The solution, the substrate, or both can be heated to a temperature no greater than about 115° C., no greater than about 100° C., no greater than about 90° C., or no greater than about 80° C. Additionally, the solution, the substrate, or both can be heated to a temperature of at least about 30° C., at least about 45° C., at least about 60° C., or at least about 75° C. Furthermore, the solution, the substrate, or both can be heated to a temperature included in a range of about 40° C. to about 100° C. The solution, the substrate, or both can also be heated to a temperature included in a range of about 65° C. to about 85° C. Optionally, the solution can be heated to a temperature that is less than the flash point of the solution. An amount of heat to increase a temperature of the solution and/or the substrate can be provided by a heat source, such as a conductive heat source or a convective heat source.

The substrate can be contacted with the solution for a specified duration that is no greater than about 180 minutes, no greater than about 150 minutes, no greater than about 120 minutes, or no greater than about 90 minutes. Additionally, the substrate can be contacted with the solution for a specified duration that is at least about 10 minutes, at least about 25 minutes, at least about 40 minutes, or at least about 60 minutes. Further, the substrate can be contacted with the solution for a duration included in a range of about 10 minutes to about 120 minutes. The substrate can also be contacted with the solution for a duration included in a range of about 45 minutes to about 70 minutes.

The substrate can be immersed in the solution. For example, the substrate can be immersed in a bath of the solution. In some cases, the substrate can be immersed in a bath with one or more additional substrates. The solution can also be applied to one or more sides of the substrate. In an example, one or more sides of the substrate can be coated with the solution. To illustrate, one or more sides of the substrate can be sprayed with the solution, such as using one or more nozzles. Additionally, the solution can be spin coated onto one or more sides of the substrate. When multiple sides of the substrate are contacted with the solution, the solution can be applied to each side in a sequential manner. That is, the solution can be applied to a side of the substrate for a specified period of time and under suitable conditions, and then the solution can be applied to an additional side of the substrate. Alternatively, the solution can be applied to multiple sides of the substrate substantially contemporaneously. A volume of the solution can be added to a container including the substrate such that the thickness of the solution substantially covers at least one side of the substrate. The thickness of the liquid coating above the wafer may be thinner or thicker depending on the application and the substance (e.g., resist) to be removed. Furthermore, the solution can be agitated while the substrate is contacted with the solution. The substrate can be agitated by mechanical stirring, circulating, by bubbling an inert gas through the solution, or combinations thereof.

After being contacted with the solution for a period of time, the substrate can then be rinsed and dried. For example, the substrate can be subjected to one or more rinse operations using deionized water (DI) and/or low boiling point solvents such as acetone and isopropyl alcohol (IPA). The substrate can be rinsed using multiple operations, such as a DI rinse followed by an IPA rinse. Alternatively, the substrate can be rinsed in IPA followed by a DI rinse. The order in which these rinsing steps is applied may vary, and rinsing steps may be repeated multiple times. Optionally, one or more rinsing operations can be performed using pressurized water. After one or more rinsing operations, the substrate can be subjected to one or more drying operations, such as drying using a stream of one or more of air, nitrogen, or argon, or surface tension gradient drying (Marangoni effect). When a plurality of rinsing steps are performed, one or more drying steps may be performed in between rinsing steps. Optionally, the substrate can be contacted alternately by the solution and the rinse media in multiple alternating process steps.

Before the substrate is contacted with the solution, the substrate can be subject to one or more processes to form features on the substrate. For example, one or more solder bumps can be formed on the first side of the substrate, the second side of the substrate, or the first side of the substrate and the second side of the substrate. In another example, the one or more solder bumps can be heated to melt the one or more solder bumps and join the one or more solder bumps to one or more features of the substrate. To illustrate, the substrate can be subject to a solder reflow process. Additionally, one or more metal features can be formed on the first side of the substrate, the second side of the substrate, or the first side of the substrate and the second side of the substrate. Further, one or more dielectric material features can be formed on the first side of the substrate, the second side of the substrate, or the first side of the substrate and the second side of the substrate. Also, the substance, such as a photoresist, can be depositing onto the first side of the substrate, the second side of the substrate, or the first side of the substrate and the second side of the substrate to form openings for solder bumps or the one or more metal features, onto the one or more dielectric material features, or combinations thereof. A pattern can be formed from the photoresist by a number of processes. In an example, the pattern can be formed by exposing the photoresist to a form of electromagnetic radiation. In an illustrative example, the pattern can be formed by exposing the photoresist to actinic radiation. The photoresist can be a negative photoresist or a positive photoresist.

After contacting the substrate with the solution, the substrate can be subjected to one or more downstream processes. For example, the substrate can undergo a process to connect leads on a semiconductor chip package to circuit features on a printed circuit board, such as a solder printing/plating process and/or an additional solder reflow process.

Optionally, the conditions of the process 200 can depend on a type of photoresist disposed on a substrate, a thickness of the photoresist disposed on the substrate, or both. For example, a photoresist coating that is applied as dry film has a higher ratio of solids to solvent compared to a photoresist coating that is applied as a liquid. In situations where a photoresist has a higher relative content of solvent, for example, a photoresist coating that is applied as a liquid, the polymer chains are less tightly organized and can require less energy to penetrate, separate and remove than photoresist that has a relatively higher content of solids, for example, a photoresist coating that is applied as a dry film, with polymer chains packed with higher density. Thus, a dry film photoresist can require different processing conditions to remove (e.g., higher process temperatures, longer dwell times) than photoresist applied as a liquid because separation of the polymer chains in the dry film photoresist can take more energy.

Furthermore, substrates having different thicknesses and types of photoresists may be processed differently because differing amounts of solid polymer or byproducts of decomposition reactions may be formed. Thus, the thickness and type of photoresist on a substrate may determine how long a bath can effectively remove photoresist from substrates. For example, liquid negative photoresists are lower in solids content, require less energy to clean, and more substrates can be cleaned in a single bath than substrates coated with a dry film photoresist.

By applying the process 200 using the formulations of solutions described herein, both liquid photoresist and dry film photoresist can be removed from a substrate. Additionally, photoresist having different thicknesses can also be removed from a substrate. Furthermore, removal of substances according to implementations described herein minimizes the use of harmful materials during the removal of substances from a substrate. Also, the homogeneity of the solutions can be maintained using the formulations described herein.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

EXAMPLES

In the examples below, various stripping compositions were used to remove a negative patterned thick-acrylic-based polymer films or photoresists, filled with a lead-free solder, and patterned on a dielectric material. Cleaning studies to remove the patterned photoresist film from the wafer coupons, which had been subjected to additional thermal treatment after solder deposition were performed using a batch immersion process.

Coupon-sized samples of semiconductor wafers were processed in beakers. The beakers were filled with 100 mL of a stripping solution and heated using a hot plate to the target temperature of 85° C. When the stripping solution was at the target temperature, a coupon was placed in a holder in the beaker, and slight agitation was provided by a stir bar. Temperature was maintained at the target temperature of 85° C. throughout the process. After a total processing time of 60 minutes, the coupons were removed from the beaker, rinsed with DI water and IPA, and dried with a stream of air.

For the experiments described below, compositions of all solutions tested are shown in Table 1. The components of each of the solutions in Table 1 total 100%. Any solutions not having components listed that total 100% are due to rounding of the amounts of the components of the solution. Solution homogeneity of the stripping solution was observed and recorded. Solution homogeneity was determined by visual observation. Solution homogeneity was recorded as "homogeneous" if a sample of the stripping solution was left undisturbed at about 23° C. for 24 hours and remained homogeneous. An inhomogeneous stripping solution was defined as a stripping solution with components that were not miscible when combined, resulted in more than one phase upon mixing, or resulted in more than one phase 24 hours after mixing. Solutions which became homogeneous after heating were recorded, but not used further. In subsequent examples, polymer film removal characteristics of each of the formulations in Table 1 were determined by removal of a photoresist which was an acrylic-based polymer film on a wafer coupon. Photoresist or polymer film removal is defined as "clean" if all polymer was removed from the wafer coupon surface; as "mostly clean" if at least 80% of the polymer was removed from the surface; "partly clean" if about 50% of the polymer was removed from the surface; and "not clean" if <50% of the polymer was removed from the surface. Silicon compatibility was recorded as "good" if the mirror-finished backside of the test coupon maintained the mirror finish with no visual blemishes. Silicon compatibility was recorded as "bad" if the mirror-finished backside of the test coupon became hazy after the cleaning test due to roughening that resulted in a loss of the mirror finish. For select solutions, the kinematic viscosity was measured following ASTM method D445 using Ubbelohde capillary viscometers in a water bath at 25° C. The dynamic viscosity (cP) was calculated by multiplying the kinematic viscosity (cSt) by the solution density. The solution density was estimated by calculating the weight average density of the components of the solution.

The follow abbreviations are used in the various formulations of solutions listed in Table 1: TEPA=tetraethylpentamine; MEA=monoethanolamine; MMB=3-methoxy 3-methylbutanol; TMAH=tetramethylammonium hydroxide; DMDA=N,N-dimethyl 9-decenamide; TETA=triethylenetetramine; TEGME=Triethylene glycol monomethyl ether; DMDAA=N,N-dimethyldecanamide; DIMLA 1214=mixture of dimethyldodecylamine and dimethyltetradecylamine; DMAC=dimethylacetamide; DMF=dimethyl formamide; PG=propylene glycol; TEAH=tetraethylammonium hydroxide; DMDPAH=dimethyldipropylammonium hydroxide; BA=benzyl amine.

TABLE 1

Summary of Tested Formulations: Composition and Solution Homogeneity

| Formulation Identifier | Solution Formulation | Homogeneous Solution Stability, 23° C., after 24 hrs. |
| --- | --- | --- |
| 1 | 56 wt. % TEPA, 33 wt. % MEA, 5 wt. % benzyl amine, 3 wt. % TMAH, 3 wt. % H$_2$O | Homogeneous |
| 2 | 41 wt. % TEPA, 33 wt. % MEA, 20 wt. % benzyl amine, 3 wt. % TMAH, 3 wt. % H$_2$O | Homogeneous |
| 3 | 32 wt. % TEPA, 31 wt. % MEA, 31 wt. % benzyl amine, 3 wt. % TMAH, 3 wt. % H$_2$O | Homogeneous |
| 4 | 44 wt. % TEPA, 33 wt. % MEA, 20 wt. % benzyl amine, 1.5 wt. % TMAH, 1.5 wt. % H$_2$O | Homogeneous |
| 5 | 59 wt. % TEPA, 33 wt. % MEA, 5 wt. % benzyl amine, 1.5 wt. % TMAH, 1.5 wt. % H$_2$O | Homogeneous |
| 6 | 56 wt. % TEPA, 38 wt. % MEA, 1.5 wt. % TMAH, 4.5 wt. % H$_2$O | Homogeneous |
| 7 | 59 wt. % TEPA, 35 wt. % MEA, 3 wt. % TMAH, 3 wt. % H$_2$O | Homogeneous |
| 8 | 59 wt. % TEPA, 38 wt. % MEA, 1.5 wt. % TMAH, 1.5 wt. % H$_2$O | Homogeneous |
| 9 | 94 wt. % TEPA, 3 wt. % MEA, 1.5 wt. % TMAH, 1.5 wt. % H$_2$O | Homogeneous |
| 10 | 65 wt. % TEPA, 22 wt. % benzyl amine, 10 wt. % benzyl alcohol, | Homogeneous |

TABLE 1-continued

Summary of Tested Formulations: Composition and Solution Homogeneity

| Formulation Identifier | Solution Formulation | Homogeneous Solution Stability, 23° C., after 24 hrs. |
|---|---|---|
| 11 | 1.5 wt. % TMAH, 1.5 wt. % $H_2O$ 59 wt. % TEPA, 38 wt. % benzyl alcohol, 1.5 wt. % TMAH, 1.5 wt. % $H_2O$ | Homogeneous |
| 12 | 59 wt. % TEPA, 3 wt. % MEA, 35 wt. % benzyl amine, 1.5 wt. % TMAH, 1.5 wt. % $H_2O$ | Inhomogeneous |
| 13 | 55 wt. % TEPA, 33 wt. % MEA, 5 wt. % benzyl amine, 3 wt. % TMAH, 3 wt. % $H_2O$ 1 wt. % benzyl alcohol | Homogeneous |
| 14 | 55 wt. % TEPA, 33 wt. % MEA, 5 wt. % benzyl amine, 3 wt. % TMAH, 3 wt. % $H_2O$ 1 wt. % TEGME | Homogeneous |
| 15 | 55 wt. % TEPA, 33 wt. % MEA, 5 wt. % benzyl amine, 3 wt. % TMAH, 3 wt. % $H_2O$ 1 wt. % DE solvent | Homogeneous |
| 16 | 55 wt. % TEPA, 33 wt. % MEA, 5 wt. % benzyl amine, 3 wt. % TMAH, 3 wt. % $H_2O$ 1 wt. % DB solvent | Homogeneous |
| 17 | 55 wt. % TEPA, 33 wt. % MEA, 5 wt. % benzyl amine, 3 wt. % TMAH, 3 wt. % $H_2O$ 1 wt. % furfuryl alcohol | Homogeneous |
| 18 | 55 wt. % TEPA, 33 wt. % MEA, 5 wt. % benzyl amine, 3 wt. % TMAH, 3 wt. % $H_2O$ 1 wt. % cyclohexanol | Homogeneous |
| 19 | 55 wt. % TEPA, 33 wt. % MEA, 5 wt. % benzyl amine, 3 wt. % TMAH, 3 wt. % $H_2O$ 1 wt. % MMB | Homogeneous |
| 20 | 50 wt. % TEPA, 29 wt. % MEA, 5 wt. % benzyl amine, 3 wt. % TMAH, 3 wt. % $H_2O$ 10 wt. % MMB | Homogeneous |
| 21 | 40 wt. % TEPA, 25 wt. % MEA, 5 wt. % benzyl amine, 2.8 wt. % TMAH, 2.8 wt. % $H_2O$ 24.4 wt. % MMB | Homogeneous |
| 22 | 28 wt. % TEPA, 27.4 wt. % TETA, 33 wt. % MEA, 5 wt. % benzyl amine, 2.8 wt. % TMAH, 2.8 wt. % $H_2O$ 1 wt. % MMB | Homogeneous |
| 23 | 40 wt. % TEPA, 25 wt. % MEA, 23.4 wt. % DMDA, 5 wt. % benzyl amine, 2.8 wt. % TMAH, 2.8 wt. % $H_2O$ 1 wt. % MMB | Homogeneous |
| 24 | 88.4 wt. % MEA, 5 wt. % benzyl amine, 2.8 wt. % TMAH, 2.8 wt. % $H_2O$ 1 wt. % MMB | Homogeneous |
| 25 | 28.4 wt. % TEPA, 10 wt. % MEA, 50 wt. % DMDA, 5 wt. % benzyl amine, 2.8 wt. % TMAH, 2.8 wt. % $H_2O$ 1 wt. % MMB | Inhomogeneous |
| 26 | 40 wt. % TEPA, 25 wt. % MEA, 23.4 wt. % DMDAA, 5 wt. % benzyl amine, 2.8 wt. % TMAH, 2.8 wt. % $H_2O$, 1 wt. % MMB | Homogeneous @ >60° C. |
| 27 | 40 wt. % TEPA, 25 wt. % MEA, 23.4 wt. % DIMLA 1214, 5 wt. % benzyl amine, 2.8 wt. % TMAH, 2.8 wt. % $H_2O$, 1 wt. % MMB | Inhomogeneous |
| 28 | 40 wt. % TEPA, 25 wt. % MEA, 23.4 wt. % DMAC, 5 wt. % benzyl amine, 2.8 wt. % TMAH, 2.8 wt. % $H_2O$, 1 wt. % MMB | Homogeneous |
| 29 | 40 wt. % TEPA, 25 wt. % MEA, 23.4 wt. % DMF, 5 wt. % benzyl amine, 2.8 wt. % TMAH, 2.8 wt. % $H_2O$, 1 wt. % MMB | Homogeneous |
| 30 | 40 wt. % TEPA, 25 wt. % MEA, 16.1 wt. % DMDA, 5 wt. % benzyl amine, 4.515 wt. % TEAH, 8.385 wt. % $H_2O$, 1 wt. % MMB | Homogeneous @ >40° C. |
| 31 | 30 wt. % TEPA, 18 wt. % MEA, 23.4 wt. % DMDA, 5 wt. % benzyl amine, 4.52 wt. % DMDPAH, 18.08 wt. % PG 1 wt. % MMB | Homogeneous |
| 32 | 94.4% TEPA 2.8% TMAH 2.8% $H_2O$ | Inhomogeneous |
| 33 | 94.4% MEA 2.8% TMAH 2.8% $H_2O$ | Homogeneous |
| 34 | 94.4% benzyl amine 2.8% TMAH 2.8% $H_2O$ | Inhomogeneous |
| 35 | 41 wt. % TEPA, 27 wt. % MEA, 25.4 wt. % DMDA, | Homogeneous |

TABLE 1-continued

Summary of Tested Formulations: Composition and Solution Homogeneity

| Formulation Identifier | Solution Formulation | Homogeneous Solution Stability, 23° C., after 24 hrs. |
|---|---|---|
| 36 | 5.6 wt. % benzyl amine, 1 wt. % MMB 40 wt. % TEPA, 26 wt. % MEA, 24.4 wt. % DMDA, | Homogeneous |
| 37 | 5.6 wt. % benzyl amine, 1 wt. % MMB 3 wt. % H$_2$O 40 wt. % TEPA, 25 wt. % MEA, 16 wt. % DMDA, | Homogeneous |
| 38 | 5 wt. % benzyl amine, 2.8 wt. % TMAH, 11.2 wt. % PG 41% TEPA 25% MEA 23.4% DMDA 5% benzyl amine 2.8% TMAH 2.8% H$_2$O | Homogeneous |
| 39 | 65% TEPA 35% MEA | Homogeneous |
| 40 | 56% TEPA 39% MEA 5% BA | Homogeneous |
| 41 | 62% TEPA 32.4% MEA 2.8% TMAH 2.8% H$_2$O | Homogeneous |
| 42 | 60 wt. % TEPA, 26 wt. % MEA, 2.8 wt. % TMAH, 11.2 wt. % PG | Homogeneous |
| 43 | 55 wt. % TEPA, 26 wt. % MEA, 5 wt. % BA 2.8 wt. % TMAH, 11.2 wt. % PG | Homogeneous |

Examples 1-10 were completed using wafer coupons patterned with a photoresist which was an acrylic-based polymer film filled with a lead-free solder. Applicant notes that the amounts of the amines included in solution affected the cleaning properties and homogeneity of the solution. In particular, the amount of TEPA in the solution had an effect on the cleaning properties of the solution. The use of solutions that included TEPA and provided "Good" cleaning results was unexpected in that TEPA is a relatively large and cumbersome compound when compared with other amines which typically makes it less appealing for use in a stripping solution that has to penetrate into an organic polymer.

Example 1

Table 2 lists cleaning results of stripping solutions that were tested for the ability to remove negative patterned thick acrylic-based photoresist coatings, filled with a lead-free solder, where the photoresist has undergone additional thermal processing, using the immersion process described above. Two different types of thick acrylic-based photoresist coatings were tested, noted as Type I and Type II, where the different types have different methods of application and are supplied by different photoresist coating suppliers. The test samples included semiconductor wafer coupons with dielectric films contacting the underside of the photoresist film. The results shown in Table 2 illustrate concentration ranges for the components of the stripping solutions, with formulations 1, 2, and 12 showing the greatest performance advantages.

TABLE 2

| Formulation Identifier | Type I Photoresist Removal Results | Silicon Compatibility |
|---|---|---|
| 1 | Clean | Good |
| 2 | Clean | Good |
| 3 | Mostly Clean | Good |
| 4 | Mostly Clean | Good |
| 5 | Mostly Clean | Good |
| 6 | Mostly Clean | Good |
| 7 | Mostly Clean | Good |
| 8 | Mostly Clean | Good |
| 9 | Partly Clean | Good |
| 10 | Partly Clean | Good |
| 11 | Not Clean | Good |
| 12 | Clean | Good |

Example 2

Table 3 lists cleaning results of stripping solutions that were tested for the ability to remove a negative tone patterned thick acrylic-based photoresist coating, filled with a lead-free solder, where the coating has undergone additional thermal processing, using the immersion process described above. Two different types of thick acrylic-based photoresist coatings were tested, noted as Type I and Type II, where the different types have different methods of application and are supplied by different photoresist coating suppliers. The test samples included semiconductor wafer coupons with dielectric films contacting the underside of the photoresist coating. The results shown in Table 3 illustrate the performance advantage of the mixture of amines. In this case, results were recorded as NA if the solution was inhomogeneous as further testing was not done. The * indicates that polar protic solvent was also introduced to yield a homogeneous solution for testing.

TABLE 3

| Formulation Identifier | Number of amines | Photoresist Removal Results | Photoresist Type | Silicon Compatibility |
|---|---|---|---|---|
| 32 | 1 | NA | II | NA |
| 33 | 1 | Partly Clean | II | Good |
| 34 | 1 | NA | II | NA |
| 6 | 2 | Mostly Clean | I | Good |
| 10 | 2 | Partly Clean* | I | Good |
| 24 | 2 | Not Clean | I | Good |
| 39 | 2 | Mostly Clean | II | Good |

Example 3

Table 4 lists cleaning results of stripping solutions that were tested for the ability to remove a negative patterned thick acrylic-based photoresist coating, filled with a lead-free solder, where the coating has undergone additional thermal processing, using the immersion process described above. The test samples included semiconductor wafer coupons with dielectric films contacting the underside of the photoresist coating. The results shown in Table 4 illustrate the addition of an amine or an alkyl ammonium hydroxide to further improve the cleaning result.

TABLE 4

| Formulation Identifier | Total # of Components | Additional Component(s) | Type II Photoresist Removal Results | Silicon Compatibility |
|---|---|---|---|---|
| 39 | 2 | NA | Mostly Clean | Good |
| 40 | 3 | Benzyl amine | Clean | Good |
| 41 | 4 | TMAH, H$_2$O | Clean | Good |
| 42 | 4 | TMAH, PG | Clean | Good |

Example 4

Table 5 lists cleaning results of stripping solutions that were tested for the ability to remove a negative patterned thick acrylic-based photoresist coating, filled with a lead-free solder, where the coating has undergone additional thermal processing, using the immersion process described above. The test samples included semiconductor wafer coupons with dielectric films contacting the underside of the photoresist coating. The results shown in Table 5 illustrate the performance advantage related to inclusion of tetramethylammonium hydroxide in the formulation.

TABLE 5

| Formulation Identifier | [TMAH] | Photoresist Removal Results | Photoresist Type | Silicon Compatibility |
|---|---|---|---|---|
| 1 | 3 | Clean | I | Good |
| 2 | 3 | Clean | I | Good |
| 4 | 1.5 | Mostly Clean | I | Good |
| 35 | 0 | Partly Clean | II | Good |
| 36 | 0 | Mostly Clean | II | Good |

Where [TMAH] is in weight percent of a total weight of the solution.

Example 5

Table 6 lists cleaning results of stripping solutions that were tested for the ability to remove a negative patterned thick acrylic-based photoresist coating, filled with a lead-free solder, where the coating has undergone additional thermal processing, using the immersion process described above. The test samples included semiconductor wafer coupons with dielectric films contacting the underside of the photoresist coating. The results shown in Table 6 illustrate that formulations of stripping solutions that include TMAH can provide improved results over stripping solutions that contain alternative alkyl ammonium hydroxides.

TABLE 6

| Formulation Identifier | Alkyl ammonium hydroxide | Type I Photoresist Removal Results | Silicon Compatibility |
|---|---|---|---|
| 30 | TEAH | Partly Clean | Bad |
| 31 | DMDPAH | Not Clean | Good |

Example 6

Table 7 lists cleaning results of stripping solutions that were tested for the ability to remove a negative patterned thick acrylic-based photoresist coating, filled with a lead-free solder, where the coating has undergone additional thermal processing, using the immersion process described above. The test samples included semiconductor wafer coupons with dielectric films contacting the underside of the photoresist coating. Although it is difficult to include alkyl ammonium hydroxides without also including water, a few options to control the water concentration exist. The results shown in Table 7 illustrate the effect of controlling water in the formulation.

TABLE 7

| Formulation Identifier | Concentration of Water | Photoresist Removal Results | Photoresist Type | Silicon Compatibility |
|---|---|---|---|---|
| 23 | 2.8 | Clean | I, II | Good |
| 37 | 0 | Clean | II | Good |

Where water concentration is listed as wt. % of total weight of the solution.

Example 7

Table 8 lists cleaning results of stripping solutions that were tested for the ability to remove a negative patterned thick acrylic-based photoresist coating, filled with a lead-free solder, where the coating has undergone additional thermal processing, using the immersion process described above. The test samples included semiconductor wafer coupons with dielectric films contacting the underside of the photoresist coating. The results shown in Table 8 illustrate the incorporation of a polar protic solvent for improved solution homogeneity. A performance benefit was shown using Formulation 19. Typically addition of a polar protic solvent may decrease the cleaning efficiency of the stripper solution for photoresist removal, particularly in more challenging strip processes, like removal of negative patterned photoresist coatings. However, they may assist in creating a formulation with increased compatibility with permanent materials on the wafer surface and may assist in maintaining the homogeneity of the strip solution over time by increasing and stabilizing the solubility of solids dissolved in the formulation. In the case of adding MMB in formulation 19, the unexpected result of the complete polymer removal was obtained.

TABLE 8

| Formulation Identifier | Polar Protic Solvent | Type I Photoresist Removal Results | Silicon Compatibility |
|---|---|---|---|
| 13 | Benzyl alcohol | Mostly Clean | Good |
| 14 | TEGME | Mostly Clean | Good |
| 15 | DE solvent | Mostly Clean | Good |
| 16 | DB solvent | Mostly Clean | Good |
| 17 | Furfuryl alcohol | Mostly Clean | Good |
| 18 | Cyclohexanol | Mostly Clean | Good |
| 19 | MMB | Clean | Good |

Example 8

Table 9 lists cleaning results of stripping solutions that were tested for the ability to remove a negative tone acrylic-based photoresist film filled with lead free solder where the photoresist has undergone additional thermal processing, using the immersion process described above. The test samples included semiconductor wafer coupons with dielectric films contacting the underside of the photoresist coating. The results shown in Table 9 illustrate the effect of changing concentration of the polar protic solvent.

TABLE 9

| Formulation Identifier | Concentration of Polar Protic Solvent | Type I Photoresist Removal Results | Silicon Compatibility |
|---|---|---|---|
| 19 | 1 | Clean | Good |
| 20 | 10 | Clean | Good |
| 21 | 24.4 | Mostly Clean | Good |

Where the concentration is recorded as wt. % for a total weight of the solution

Example 9

In some instances, stripping solution with lower viscosities may be utilized due to process machinery. Solutions were evaluated for reducing viscosity while maintaining complete photoresist coating removal, solution stability, and silicon compatibility. Several approaches were taken to reduce the viscosity, including (i) modifying the concentration of the formulation by substituting the highest viscosity amines with increased amounts of other components in the solution or other low viscosity amines (ii) by dilution of the formulation using a low viscosity polar protic solvent and (iii) by dilution of the formulation using a low viscosity amide. Table 10 lists formulations of stripping solutions that were tested for Example 9 using the immersion process described above and semiconductor wafer coupons with dielectric substrates. The results shown in Table 10 illustrate that stripping solutions having formulations described according to implementations herein with varying viscosities can achieve complete polymer removal. Additionally, the results shown in Table 10 indicate that several solutions using an amide to reduce the viscosity of the solution maintain their ability to remove the polymer coating from the substrate. Thus, adding an amide rather than some polar protic solvents can provide some advantages in relation to cleaning ability and viscosity reduction.

TABLE 10

| Formulation Identifier | Strategy | Dynamic Viscosity (centipoise) | Photoresist Removal Results | Photoresist Type | Silicon Compatibility |
|---|---|---|---|---|---|
| 20 | ii | NA | Clean | I | Good |
| 21 | ii | 42.7 | Mostly Clean | I | Good |
| 22 | i | 34.3 | Mostly Clean | I | Good |
| 23 | iii | 22.9 | Clean | I, II | Good |
| 24 | i | 17.4 | Not Clean | I | Good |
| 25 | iii | NA | Clean | I | Good |
| 26 | iii | NA | Not Clean | I | Good |
| 27 | i | NA | N/A | I | N/A |
| 28 | iii | 15.9 | Clean | I, II | Good |
| 29 | iii | NA | Partly Clean | I | Good |
| 38 | iii | 27.8 | Clean | II | Good |

Where NA designates not available.

Example 10

In some instances, stripping solutions may be used to remove negative patterned thick-acrylic-based photoresist films filled with lead-free solder from organic dielectric substrates, supplied by other photoresist coating suppliers. Table 11 lists cleaning results of stripping solutions that were tested for Example 10 using an immersion process and semiconductor wafers with dielectric substrates. The results shown in Table 11 illustrate that stripping solutions having formulations described according to implementations herein can achieve complete removal of thick-acrylic-based photoresist coating from organic dielectric substrates.

TABLE 11

| Formulation Identifier | Dynamic Viscosity (centipoise) | Type II Photoresist Removal Results | Silicon Compatibility |
|---|---|---|---|
| 13 | NA | Clean | Good |
| 14 | NA | Clean | Good |
| 15 | NA | Clean | Good |
| 16 | NA | Clean | Good |
| 17 | NA | Clean | Good |
| 18 | NA | Clean | Good |
| 21 | 42.7 | Clean | Good |
| 22 | 34.3 | Clean | Good |
| 23 | 22.9 | Clean | Good |
| 24 | 17.4 | Mostly Clean | Good |
| 28 | 15.9 | Clean | Good |
| 37 | 43.7 | Clean | Good |
| 38 | 27.8 | Clean | Good |
| 40 | NA | Clean | Good |
| 41 | 68.0 | Clean | Good |
| 42 | 83.4 | Clean | Good |
| 43 | 65.5 | Clean | Good |

Illustrative Examples of the Invention

While Applicant's disclosure includes reference to specific implementations above, it will be understood that modifications and alterations may be made by those practiced in the art without departing from the spirit and scope of the inventive features described herein. All such modifications and alterations are intended to be covered. As such the illustrative examples of the invention listed below are merely illustrative and not limiting.

Example 1

A solution comprising: a first amine; a second amine; a third amine; and a quaternary ammonium hydroxide; wherein the first amine, the second amine, and the third amine are each different compounds.

Example 2

The solution of example 1, wherein a total amount of amines in the solution includes an amount of the first amine, an amount of the second amine, and an amount of a third amine and the total amount of any and all amine compounds in the solution is no greater than about 95% by weight of a total weight of the solution.

Example 3

The solution of example 1 or 2, wherein the first amine comprises an aliphatic amine, is not an alkanolamine, and is present in an amount of at least about 35% by weight of a total weight of the solution.

Example 4

The solution of any of examples 1 to 3, wherein the second amine comprises an alkanolamine and is present in an amount of at least about 15% by weight of a total weight of the solution.

Example 5

The solution of any of examples 1 to 4, wherein the third amine comprises an aromatic amine and is present in an amount of no greater than about 30% by weight of a total weight of the solution.

Example 6

The solution of any of examples 1 to 5, wherein the quaternary ammonium hydroxide is present in an amount no greater than about 8% by weight of a total weight of the solution.

Example 7

The solution of any of examples 1 to 6, further comprising water.

Example 8

The solution of example 7, wherein the water is present in an amount no greater than about 8% by weight of a total weight of the solution.

Example 9

The solution of example 7, further comprising a polar protic solvent other than water.

Example 10

The solution of example 9, wherein the polar protic solvent is present in an amount no greater than about 25% by weight of a total weight of the solution.

Example 11

The solution of example 9 or 10, wherein the polar protic solvent includes an alcohol, a glycol, a polyglycol, a glycol ether, or combinations thereof.

Example 12

The solution of example 10, wherein the polar protic solvent includes at least one of benzyl alcohol, diethylene glycol monobutyl ether, furfuryl alcohol, cyclohexanol, 3-methoxy 3-methylbutanol, triethylene glycol monomethyl ether, diethylene glycol monoethyl ether, propylene glycol, or mixtures thereof.

Example 13

The solution of any of examples 9 to 12, wherein the polar protic solvent does not include an amine.

Example 14

The solution of any of examples 9 to 13, further comprising an amide.

Example 15

The solution of any of examples 1 to 8, further comprising an amide present in an amount no greater than about 50% by weight of a total weight of the solution.

Example 16

The solution of any of examples 1 to 15, wherein a dynamic viscosity of the solution is no greater than about 60 centipoise.

Example 17

The solution of any of examples 1 to 16, further comprising a fourth amine that is different from the first amine, the second amine, and the third amine.

Example 18

The solution of example 17, further comprising water and a polar protic solvent other than water.

Example 19

The solution of any of examples 1 to 6, further comprising a polar protic solvent, wherein the solution is free of water.

Example 20

A solution comprising: at least one amine; a quaternary ammonium hydroxide; and water; and wherein the solution is free of a polar solvent other than water and the solution has a dynamic viscosity that is no greater than about 60 centipoise.

Example 21

The solution of example 20, wherein the at least one amine includes a plurality of amines.

Example 22

The solution of example 20 or 21, wherein the at least one amine comprises tetraethylpentamine, monoethanolamine, benzyl amine, triethylenetetramine, dimethyldodecylamine, dimethyltetradecylamine, or mixtures thereof.

Example 23

The solution of any of examples 20 to 22, wherein the quaternary ammonium hydroxide comprises tetramethyl ammonium hydroxide, tetraethylammonium hydroxide, dimethyldipropylammonium hydroxide, or mixtures thereof.

Example 24

The solution of any of examples 20 to 23, further comprising an amide that comprises N, N-dimethyl 9-decenamide, N, N-dimethyldecanamide, dimethylacetamide, or mixtures thereof.

Example 25

The solution of any of examples 20 to 24, wherein a dynamic viscosity of the solution is no greater than about 30 centipoise.

Example 26

A solution comprising: a first amine; a second amine; a third amine; a polar protic solvent other than water; and an amide; wherein the first amine, the second amine, and the third amine are each different compounds.

Example 27

The solution of example 26, further comprising water.

Example 28

The solution of example 26 or 27, wherein the first amine includes an aliphatic amine, the second amine includes an alkanolamine, and the third amine includes an aromatic amine.

Example 29

The solution of any one of examples 26 to 28, wherein the first amine includes tetraethylpentamine, the second amine includes monoethanolamine, and the third amine includes benzyl amine.

Example 30

The solution of any of examples 26 to 29, wherein the polar protic solvent other than water includes 3-methoxy 3-methylbutanol.

Example 31

The solution of any of examples 26 to 30, wherein the amide includes N,N-dimethyl 9-decenamide.

Example 32

The solution of any of examples 26 to 31, further comprising a quaternary ammonium hydroxide.

Example 33

A process comprising: providing a substrate comprising a first side and a second side substantially parallel to the first side, wherein a substance is disposed on at least a portion of first side of the substrate, at least a portion of the second side of the substrate, or both; contacting the substance on the first side of the substrate, the second side of the substrate, or both the first side of the substrate and the second side of the substrate with a solution that includes: a first amine; a second amine; a third amine; and a quaternary ammonium hydroxide; wherein the first amine, the second amine, and the third amine are each different compounds.

Example 34

The process of example 33, wherein at least one side of the substrate is contacted with the solution at a solution temperature in a range of about 40° C. to about 100° C.

Example 35

The process of example 33 or 34, wherein at least one side of the substrate is contacted with the solution for a duration in a range of about 10 minutes to about 120 minutes.

Example 36

The process of any one of examples 33 to 35, wherein contacting the substrate with the solution includes immersing the substrate in a bath of the solution.

Example 37

The process of any one of examples 33 to 36, wherein the substance includes a photoresist and the method further comprises depositing a layer of the photoresist onto one or more portions of the substrate before contacting the substrate with the solution.

Example 38

The process of example 37, wherein the substance includes a photoresist, wherein the photoresist is spin coated onto at least a portion of a first side of the substrate, at least a portion of a second side of the substrate, or at least a portion of the first side of the substrate and at least a portion of the second side of the substrate before contacting the substrate with the solution.

Example 39

The process of any one of examples 32 to 38, wherein the substance includes a photoresist and the process further comprises: forming one or more solder bumps on the first side of the substrate, the second side of the substrate, or the first side of the substrate and the second side of the substrate; heating the one or more solder bumps to melt the one or more solder bumps and join the one or more solder bumps to one or more features of the substrate; forming one or more metal features on the first side of the substrate, the second side of the substrate, or the first side of the substrate and the second side of the substrate; forming one or more dielectric material features on the first side of the substrate, the second side of the substrate, or the first side of the substrate and the second side of the substrate; depositing the photoresist onto the first side of the substrate, the second side of the substrate, or the first side of the substrate and the second side of the substrate to form openings for solder bumps or the one or more metal features, onto the one or more dielectric material features, or combinations thereof; and exposing the photoresist to a form of electromagnetic radiation before contacting the substrate with the solution.

Example 40

The solution of any one of examples 1 to 6, further comprising water and an amide.

What is claimed is:
1. A solution consisting of:
at least one aliphatic amine;
at least one alkanolamine;
at least one aromatic amine;
a quaternary ammonium hydroxide;
wherein said at least one aliphatic amine, said at least one alkanol amine and said at least one aromatic amine are different compounds;
optionally a polar protic solvent that is not an amine; and
optionally water.
2. The solution of claim 1, wherein a total amount of amines in the solution is made up of an amount of aliphatic amine, an amount of alkanol amine, and an amount of aromatic amine and the total amount of any and all amine compounds in the solution is no greater than about 95% by weight of a total weight of the solution.
3. The solution of claim 1, wherein said aliphatic amine, is not an alkanolamine, and is present in an amount of at least about 35% by weight of a total weight of the solution.

4. The solution of claim 1, wherein said alkanolamine is present in an amount of at least about 15% by weight of a total weight of the solution.

5. The solution of claim 1, wherein said aromatic amine is present in an amount of no greater than about 30% by weight of a total weight of the solution.

6. The solution of claim 1, wherein the quaternary ammonium hydroxide is present in an amount no greater than about 8% by weight of a total weight of the solution.

7. The solution of claim 1, wherein the water is present in an amount no greater than about 8% by weight of a total weight of the solution.

8. The solution of claim 1, wherein said polar protic solvent is present in an amount no greater than about 25% by weight of a total weight of the solution.

9. The solution of claim 8, wherein the polar protic solvent is an alcohol, a glycol, a polyglycol, a glycol ether, or combinations thereof.

10. The solution of claim 8, wherein the polar protic solvent is at least one of benzyl alcohol, diethylene glycol monobutyl ether, furfuryl alcohol, cyclohexanol, 3-methoxy 3-methylbutanol, triethylene glycol monomethyl ether, diethylene glycol monoethyl ether, propylene glycol, or mixtures thereof.

11. The solution of claim 1, wherein a dynamic viscosity of the solution is no greater than about 60 centipoise.

12. The solution of claim 1 wherein said alkanolamine is monoethanolamine.

13. The solution of claim 1, wherein said aromatic amine is benzyl amine, dimethylbenzyl amine, pyridine, phenethylamine, and mixtures thereof.

14. The solution of claim 1, wherein said aliphatic amine is tetraethylpentamine, triethylenetetramine, dimethyldodecylamine, dimethyltetradecylamine, or mixtures thereof.

15. The solution of claim 1, wherein the quaternary ammonium hydroxide is tetramethylammonium hydroxide, tetraethylammonium hydroxide, dimethyldipropylammonium hydroxide, or mixtures thereof.

16. The solution of claim 1, wherein a dynamic viscosity of the solution is no greater than about 30 centipoise.

17. The solution of claim 1, wherein the aliphatic amine is tetraethylpentamine, the alkanolamine is monoethanolamine, and the aromatic amine is benzyl amine.

18. The solution of claim 17, wherein the polar protic solvent other than water is 3-methoxy 3-methylbutanol.

* * * * *